United States Patent
Hsu et al.

(10) Patent No.: US 12,068,735 B2
(45) Date of Patent: Aug. 20, 2024

(54) ACOUSTIC WAVE DEVICE AND MANUFACTURING METHOD THEREOF

(71) Applicant: EPISTAR CORPORATION, Hsinchu (TW)

(72) Inventors: Ta-Cheng Hsu, Hsinchu (TW); Wei-Shou Chen, Hsinchu (TW); Chung-Jen Chung, Hsinchu (TW); Chia-Min Chang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 665 days.

(21) Appl. No.: 17/193,492

(22) Filed: Mar. 5, 2021

(65) Prior Publication Data
US 2021/0281237 A1 Sep. 9, 2021

(30) Foreign Application Priority Data
Mar. 6, 2020 (TW) .................. 109107352

(51) Int. Cl.
*H03H 9/02* (2006.01)
*H03H 3/02* (2006.01)
*H03H 9/05* (2006.01)

(52) U.S. Cl.
CPC .......... *H03H 9/02015* (2013.01); *H03H 3/02* (2013.01); *H03H 9/0514* (2013.01)

(58) Field of Classification Search
CPC .... H03H 9/02015; H03H 3/02; H03H 9/0514; H03H 2003/023; H03H 9/174; H03H 9/0547; H03H 9/1035; H03H 9/171; H03H 3/08; H03H 9/25; H03H 9/542
See application file for complete search history.

(56) References Cited

U.S. PATENT DOCUMENTS

| | | | |
|---|---|---|---|
| 10,217,930 B1* | 2/2019 | Feldman | ................ H10N 30/01 |
| 2021/0336604 A1* | 10/2021 | Yu | ...................... H03H 9/02559 |

FOREIGN PATENT DOCUMENTS

CN 110620563 A 12/2019

* cited by examiner

*Primary Examiner* — Andrea Lindgren Baltzell
*Assistant Examiner* — Kimberly E Glenn
(74) *Attorney, Agent, or Firm* — MUNCY GEISSLER OLDS & LOWE P.C.

(57) ABSTRACT

An acoustic wave device, includes piezoelectric layer having an upper piezoelectric surface and a lower piezoelectric surface; an upper electrode formed on the upper piezoelectric surface; a lower electrode; a support layer including a non-monocrystalline insulating material; and a lower cover, wherein the lower electrode and the support layer formed between the lower cover and the lower piezoelectric surface.

19 Claims, 6 Drawing Sheets

ACOUSTIC WAVE DEVICE AND MANUFACTURING METHOD THEREOF

CROSS-REFERENCE TO RELATED APPLICATIONS

This application claims priority to the benefit of Taiwan Patent Application Number 109107352 filed on Mar. 6, 2020, and the entire contents of which are hereby incorporated by reference herein in its entirety.

BACKGROUND

Technical Field

The present disclosure relates to an acoustic wave device, more specifically, to an acoustic wave device with support layer.

Description of the Related Art

The acoustic wave devices such as bulk acoustic wave resonator (BAW resonator) have the characteristics of high efficiency and high frequency. Thus, the acoustic wave devices are suitable for various electronic applications. For example, the acoustic wave devices can be applied to bulk acoustic wave resonance filters and filters of communication products. The bulk acoustic wave resonance device includes two electrodes and a piezoelectric layer is disposed therebetween, such that the sound waves oscillate in the piezoelectric layer to form a standing wave. The characteristics of the bulk acoustic wave resonance device, such as the resonance frequency, may depend on the characteristics and thickness of the piezoelectric layer and the overlap area of the electrodes.

SUMMARY OF THE DISCLOSURE

An acoustic wave device, includes piezoelectric layer having an upper piezoelectric surface and a lower piezoelectric surface; an upper electrode formed on the upper piezoelectric surface; a lower electrode; a support layer including a non-monocrystalline insulating material; and a lower cover, wherein the lower electrode and the support layer formed between the lower cover and the lower piezoelectric surface.

A manufacturing method of an acoustic wave device, includes providing a substrate; forming a piezoelectric layer by epitaxial growth, wherein the piezoelectric layer has an upper piezoelectric surface and a lower piezoelectric surface; forming an upper electrode on the upper piezoelectric surface; forming an upper cover on the upper electrode; removing the substrate; forming a lower electrode on the lower piezoelectric surface; forming a support layer on the lower piezoelectric surface; and forming a lower cover on the lower electrode and the support layer.

DETAILED DESCRIPTION OF THE EMBODIMENTS

Figure 1A:
FIGS. 1A-1H show cross-sectional views of the acoustic wave device 100 with corresponding manufacturing steps in accordance with the first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

FIGS. 1A-1H show cross-sectional views of the acoustic wave device 100 with corresponding manufacturing steps in accordance with the first embodiment of the present application.

As shown in FIG. 1A, a substrate 102 is provided. The substrate 102 includes an epitaxial substrate for epitaxial formation of a semiconductor layer thereon. The substrate 102 can be a sapphire substrate, a silicon (Si) substrate, a silicon carbide (SiC) substrate, a gallium nitride (GaN) substrate or an aluminum gallium nitride (AlGaN) substrate. Next, a piezoelectric layer 204 is formed on the upper surface of the substrate 102. In an embodiment of the present application, the piezoelectric layer 204 is formed on the substrate 102 by epitaxy process, such as metal-organic chemical vapor deposition (MOCVD), molecular beam epitaxy (MBE), or hydride vapor epitaxy (HVPE). In another embodiment of the present application, the piezoelectric layer 204 is formed on the substrate 102 by physical vapor deposition such as sputtering. The piezoelectric layer 204 can be a monocrystalline material or a polycrystalline material. The piezoelectric layer 204 may include metal nitride or metal oxide, such as aluminum nitride (AlN), aluminum gallium nitride (AlGaN), zinc oxide (ZnO) or other suitable piezoelectric materials. For example, lead zirconate titanate (PZT).

Figure 1B:
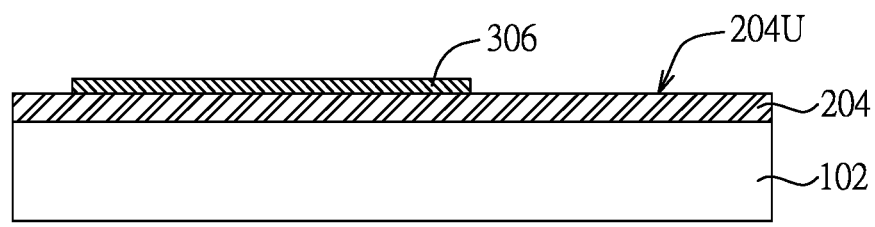

Referring to FIG. 1B, the piezoelectric layer 204 includes an upper piezoelectric surface 204U, and an upper electrode 306 is formed on the upper piezoelectric surface 204U. The material of the upper electrode 306 includes metal, such as Ti, W, Al, Ru, Ag, Cu, Au, Mo, Pt, an alloy thereof or a stack laminated by any of the above materials. In an embodiment, a conductive material layer can be formed by deposition, and then the conductive material layer can be patterned by photolithography and etching to form the upper electrode 306.

Figure 1C:
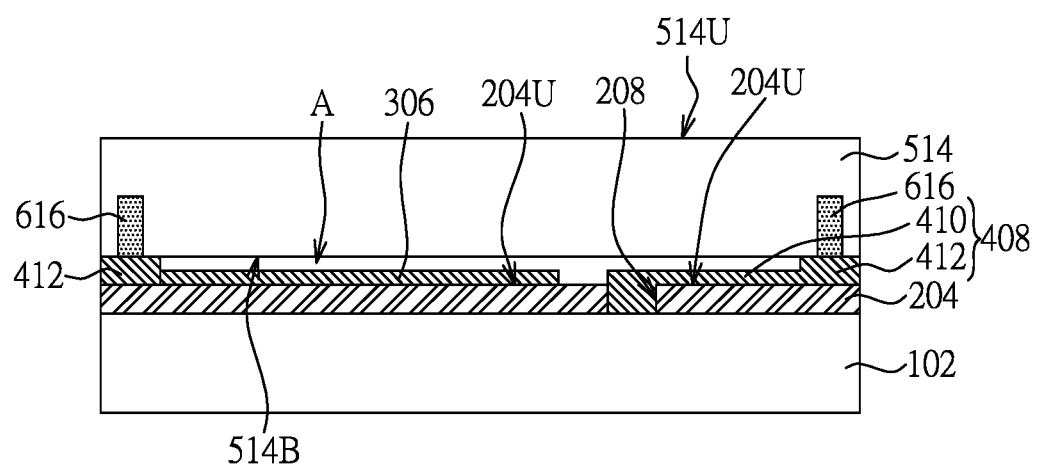

As shown in FIG. 1C, the piezoelectric layer 204 can be patterned to form an opening 208 in the piezoelectric layer 204 to expose the substrate 102. A conductive structure may be disposed on the upper piezoelectric surface 204U. The conductive structure 408 may include a conductive layer 410 and a plurality of conductive pads 412. The conductive layer 410 fills the opening 208 and extends on the upper piezoelectric surface 204U. One of the conductive pads 412 is electrically connected to the conductive layer 410, and another one of the conductive pads 412 is electrically connected to the upper electrode 306.

In another embodiment, the upper electrode 306 and the conductive structure 408 are formed after the opening 208 is formed in the piezoelectric layer 204.

Referring to FIG. 1C, an upper cover 514 is provided. The material of the upper cover 514 may include high resistivity materials such as silicon, or insulating materials such as glass, solder mask or polyimide. The upper cover 514 includes a first upper surface 514U and a first lower surface 514B. A plurality of conductive elements 616 are formed in the upper cover 514. For example, each of the conductive elements 616 may include a conductive channel and a bonding pad (not shown) corresponding to the conductive channel. In the embodiment, the conductive channel extends in the upper cover 514 and the bonding pad is located on the first lower surface 514B of the upper cover 514.

As shown in FIG. 1C, the upper cover 514 is disposed on the upper electrode 306. Specifically, the bonding pads (not shown) of the conductive elements 616 on the first lower surface 514B, can be bonded to the conductive pads 412 of the conductive structure 408, so that the conductive elements 616 are electrically connected to the upper electrode 306 and the conductive layer 410. The upper electrode 306 is located between the upper cover 514 and the upper piezoelectric surface 204U. The total thickness of the bonding pad and the conductive pad 412 after bonding is greater than the thickness of the upper electrode 306. In addition, an upper cavity A is formed between the piezoelectric layer 204, the conductive structure 408, the upper electrode 306 and the upper cover 514.

Figure 1D:
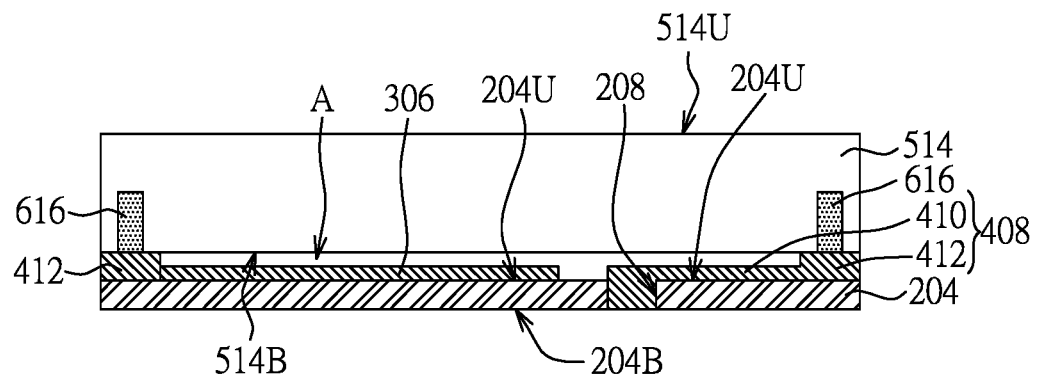

Next, referring to FIG. 1D, the substrate 102 is removed to expose a lower piezoelectric surface 204B of the piezoelectric layer 204. In an embodiment, the substrate 102 can be removed by laser lift-off. Removing the substrate by laser lift-off has the advantage of high removal rate and precise removal, which can avoid the contamination problem of etching or over-etching, and also avoid the defects caused by other removal methods, such as high temperature environment or residual etchant caused by wet etching. In an embodiment, the substrate 102 is removed to expose the lower piezoelectric surface 204B completely.

Figure 1E:
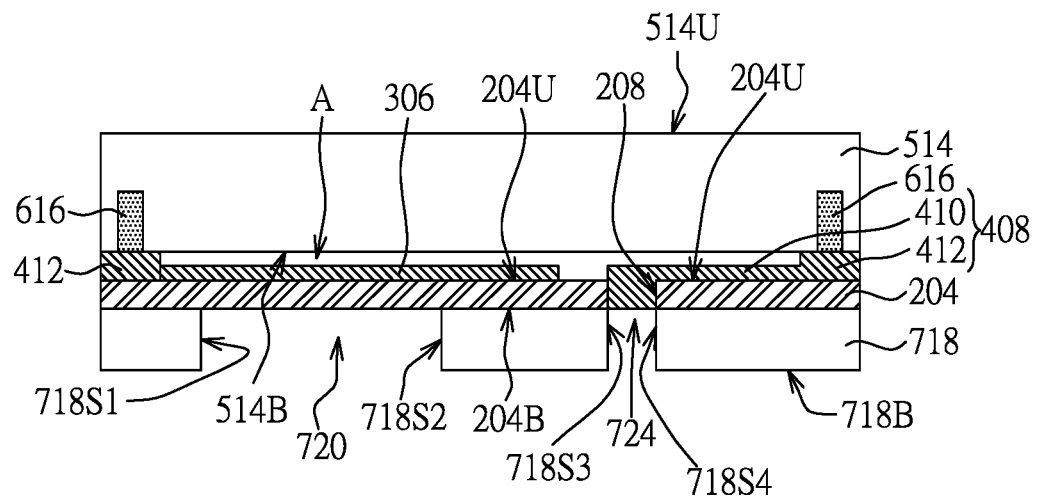

As shown in FIG. 1E, a support layer 718 is disposed on the lower piezoelectric surface 204B. The method for disposing the support layer 718 may include forming an insulating material layer on the lower piezoelectric surface 204B by deposition and then forming a first opening 720 and a second opening 724 in the insulating material layer by photolithography and etching to form the support layer 718. The first opening 720 exposes the lower piezoelectric surface 204B, and the second opening 724 exposes the conductive layer 410. The deposition process may include chemical vapor deposition or physical vapor deposition such as sputtering. The support layer 718 includes a non-monocrystalline material, such as silicon, oxide, nitride or oxynitride. The oxide includes silicon oxide ($SiO_2$) or silicon nitride (SiN), and the silicon includes poly silicon or amorphous silicon.

Figure 1F:
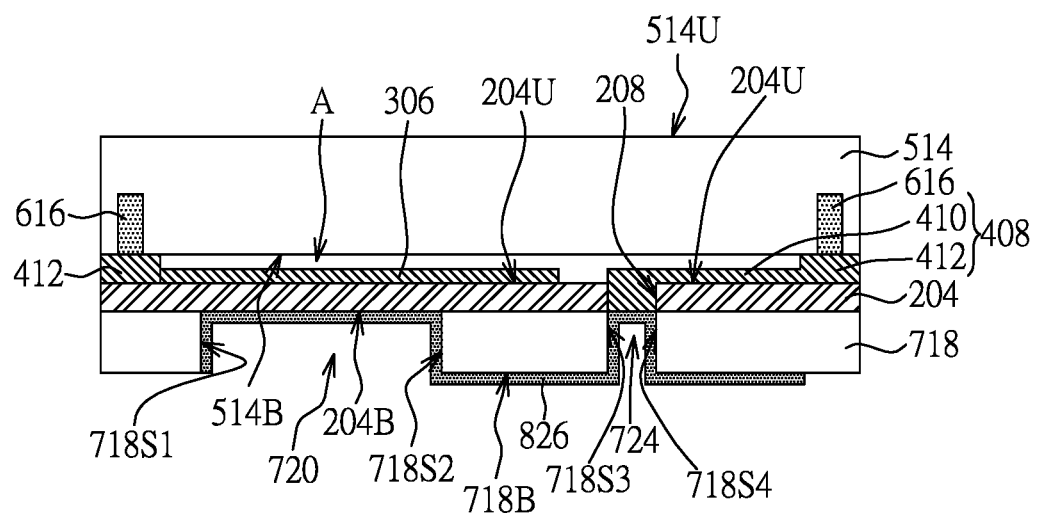

Referring to FIG. 1F, a lower electrode 826 is disposed on the other side of the piezoelectric layer 204 opposite to the upper electrode 306, that is, on the lower piezoelectric surface 204B. In detail, the lower electrode 826 is disposed on a lower support surface 718B of the support layer 718, an first inner sidewall 718S1 of the support layer 718, an second inner sidewall 718S2 of the support layer 718 and the lower piezoelectric surface 204B exposed by the first opening 720, and a third inner sidewall 718S3 of the support layer 718, a fourth inner sidewall 718S4 of the support layer 718 and a lower conductive surface of the conductive layer 410 exposed by the second opening 724. The lower electrode 826 is electrically connected to the conductive layer 410 through the second opening 724. The material of the lower electrode 826 includes metal, such as Ti, W, Al, Ru, Ag, Cu, Au, Mo, Pt, an alloy thereof or a stack laminated by any of the above materials.

Figure 1G:
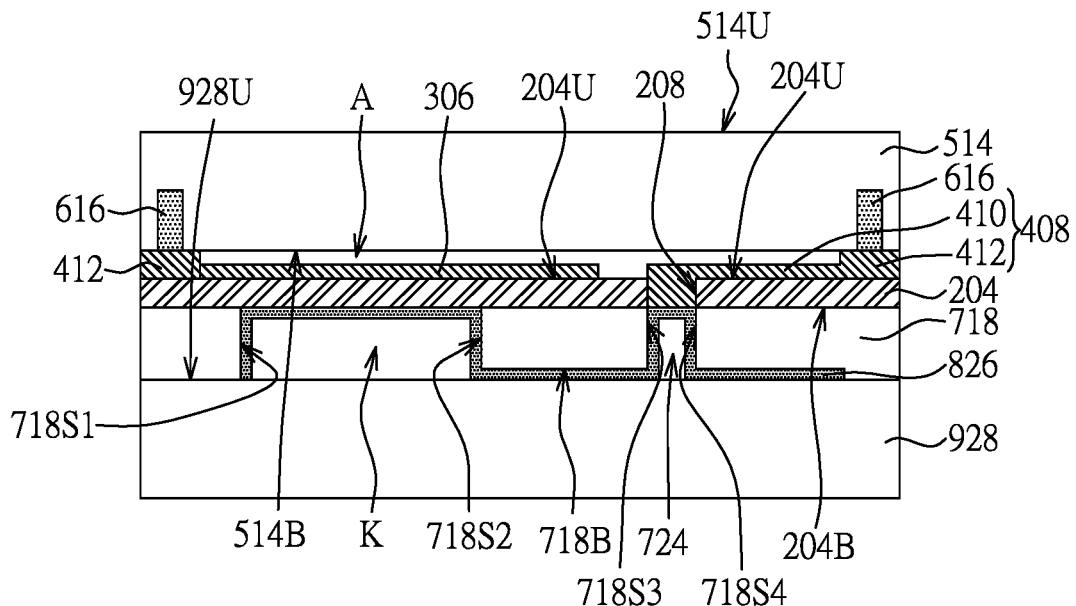

Next, Referring to FIG. 1G, a lower cover 928 is provided. The material of lower cover 928 may include high resistivity materials such as silicon, or insulating materials such as glass, solder mask or polyimide. The lower cover 928 may cover the lower electrode 826 and the support layer 718. The lower cover 928 may cover the lower electrode 826 and the support layer 718, and connected to the lower electrode 826 and the support layer 718 by bonding. In an embodiment, the lower cover 928 includes a second upper surface 928U facing the lower electrode 826 and the support layer 718, and the second upper surface 928U is a plane. As shown in FIG. 1G, the lower electrode 826 and the support layer 718 are located between the lower cover 928 and the lower piezoelectric surface 204B. In an embodiment, the substrate 102, the support layer 718 and the lower cover 928 may include different materials. A lower cavity K is formed between the lower electrode 826 formed in the first opening 720 and the lower cover 928.

Figure 1H:
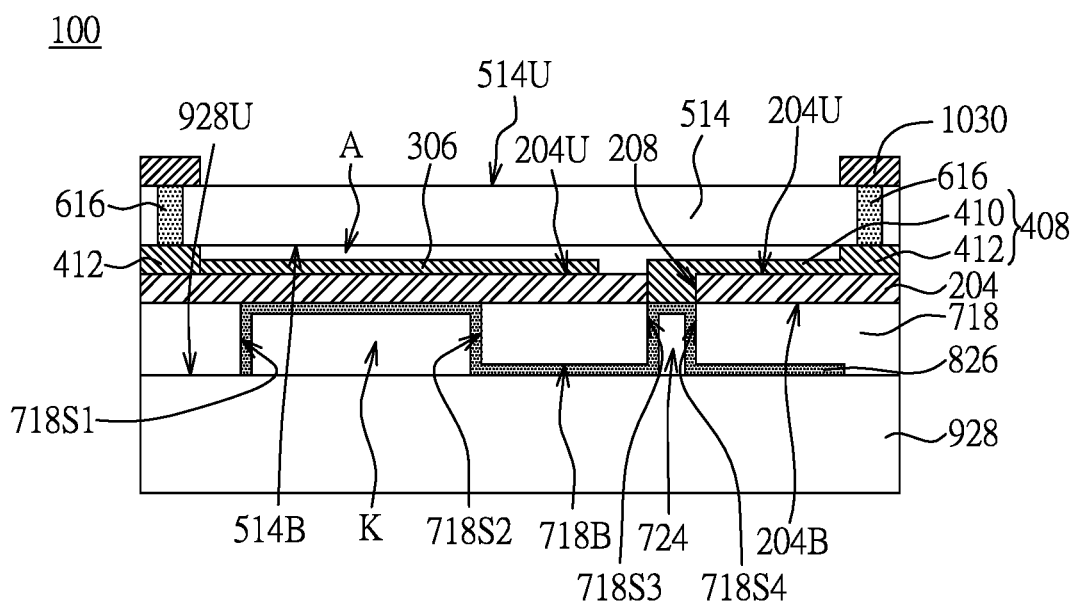

As shown in FIG. 1H, the upper cover 514 can be thinned. For example, the first upper surface 514U is polished by chemical mechanical polishing to expose the conductive elements 616. In this embodiment, for convenience of presentation, the first upper surface before and after thinning is marked as 514U. An electrode can be disposed on the first upper surface 514U. The electrode may include a plurality of contact pads 1030 disposed on the conductive channels of the conductive elements 616 exposed by the first upper surface 514U, and electrically connected to the conductive elements 616. The materials of the electrode and the contact pads 1030 may include metal.

The acoustic wave device 100 manufactured according to the manufacturing method of the first embodiment, as shown in FIG. 1H, includes a piezoelectric layer 204, an upper electrode 306, a conductive structure (including a conductive layer 410 and a plurality of conductive pads 412), an upper cover 514, a plurality of conductive elements 616, a support layer 718, a lower electrode 826, a lower cover 928 and a plurality of contact pads 1030. The piezoelectric layer 204 includes an upper piezoelectric surface 204U and a lower piezoelectric surface 204B. The upper electrode 306 formed on the upper piezoelectric surface 204U. The piezoelectric layer 204 is patterned to form an opening 208 in the piezoelectric layer 204. The conductive layer 410 fills the opening 208 and extends on the upper piezoelectric surface 204U. The conductive pads 412 are formed on the upper piezoelectric surface 204U and electrically connected to the conductive layer 410 and the upper electrode 306 respectively. The upper cover 514 is formed on the piezoelectric layer 204, the upper electrode 306 and the conductive structure 408. The conductive elements 616 are formed on the upper cover 514. The contact pads 1030 contacts the conductive elements 616 respectively. The support layer 718 is formed on the lower piezoelectric surface 204B. The support layer 718 includes a lower support surface 718B, a first inner sidewall 718S1 and a second inner sidewall 718S2 formed by a first opening 720 in the support layer 718. The support layer 718 includes a third inner sidewall 718S3 and a fourth inner sidewall 718S4 formed by a second opening 724 in the support layer 718. The lower electrode 826 is formed on the lower support surface 718B, the first inner sidewall 718S1, the second inner sidewall 718S2, the third inner sidewall 718S3, the fourth inner sidewall 718S4, the lower piezoelectric surface 204B and a lower surface of the conductive layer 410. The lower cover 928 covers the lower electrode 826 and the support layer 718. An upper cavity A is formed between the piezoelectric layer 204, the conductive structure 408, the upper electrode 306 and the upper cover 514. A lower cavity K is formed between the lower electrode 826 and the lower cover and corresponding to the first opening 720. One of the contact pads 1030 is electrically connected to the lower electrode 826 through the corresponding one of the conductive elements 616, the corresponding one of the conductive pads 410 and the conductive layer 412. Another one of the contact pads 1030 is electrically connected to the upper electrode 306 through the corresponding one of the conductive elements 616 and the corresponding one of the conductive pads 410. A voltage can be applied to the contact pads 1030 to generate an electric field between the lower electrode 826 and the upper electrode 306. The piezoelectric layer 204 can convert the electrical energy to the mechanical energy in wave form. The upper cavity A and the lower cavity K can provide the space for the resonant deformation or the resonant region of the suspended part of the piezoelectric layer 204.

Second Embodiment

Figure 2:
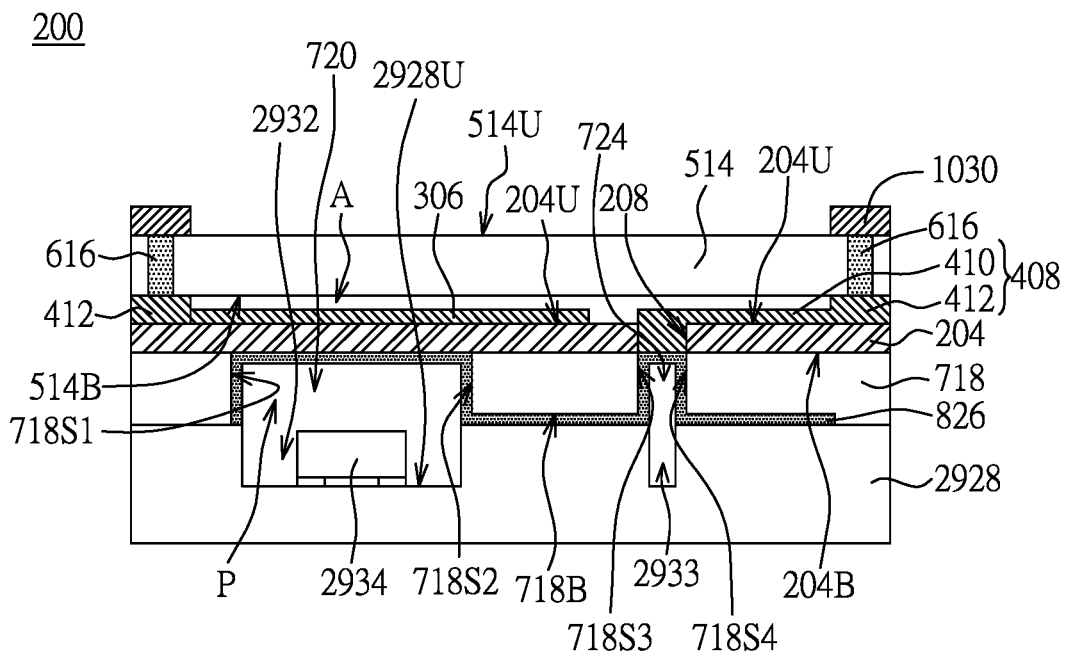
FIG. 2 shows a cross-sectional view of the acoustic wave device 200 in accordance with the second embodiment of the present application.

FIG. 2 shows a cross-sectional view of the acoustic wave device 200 in accordance with the second embodiment of the present application. The difference between the acoustic wave device 200 and the acoustic wave device 100 shown in FIG. 1H is explained as follows. The lower cover 2928 includes a first groove 2932 and a second groove 2933 facing the lower electrode 826 and not overlapping the support layer 718 in a thickness direction of the lower cover 2928. The first groove 2932 overlaps the resonant deformation or the resonant region of the suspended part of the piezoelectric layer 204. The second groove 2933 overlaps the opening 208 in the piezoelectric layer 204. In an embodiment, the lower cover 2928 may be etched to form the first groove 2932 and the second groove 2933, and then the lower cover 2928 is bonded to the lower electrode 826 and the support layer 718. In an embodiment, a passive element 2934 can be disposed in the first groove 2932 to reduce the volume of the acoustic wave device 200. The passive element 2934 not only can be disposed in the first groove 2932 in a way of flip chip as shown in FIG. 2, but also can be electrically connected to the conductive circuit (not shown) disposed on the lower cover 2928 by other methods such as wire bonding. The lower cover 2928 with the passive element 2934 disposed in the first groove 2932 is bonded to the lower electrode 826 and the support layer 718. The lower cavity P is formed between the lower electrode 826 formed in the first opening 720 and the first groove 2932 of the lower cover 2928, that is, the first opening 720 and the first groove 2932 constitute the lower cavity P.

Compared with the acoustic wave device 100 shown in FIG. 1H, the thickness of the support layer 718 of the acoustic wave device 200 in FIG. 2 may be smaller than the thickness of the support layer 718 of the acoustic wave device 100 in FIG. 1H. In an embodiment, the thickness of the support layer 718 of the acoustic wave device 200 in FIG. 2 may be smaller than 50 μm. The support layer 718 with a thinner thickness can have less stress, which can prevent the support layer 718 from peeling off from its adjacent layer. Moreover, the support layer 718 with a thinner thickness can provide a smaller bridge height for the lower electrode 826, that is, the distance between the lower piezoelectric surface 204B and the lower support surface 718B. Therefore, the problem of disconnection caused by the large bridge height for the lower electrode 826 can be avoided. A voltage can be applied to the contact pads 1030 to generate an electric field between the lower electrode 826 and the upper electrode 306. The piezoelectric layer 204 can convert the electrical energy to the mechanical energy in wave form. The upper cavity A and the lower cavity P can provide the space for the resonant deformation or the resonant region of the suspended part of the piezoelectric layer 204.

Third Embodiment

Figure 3A:
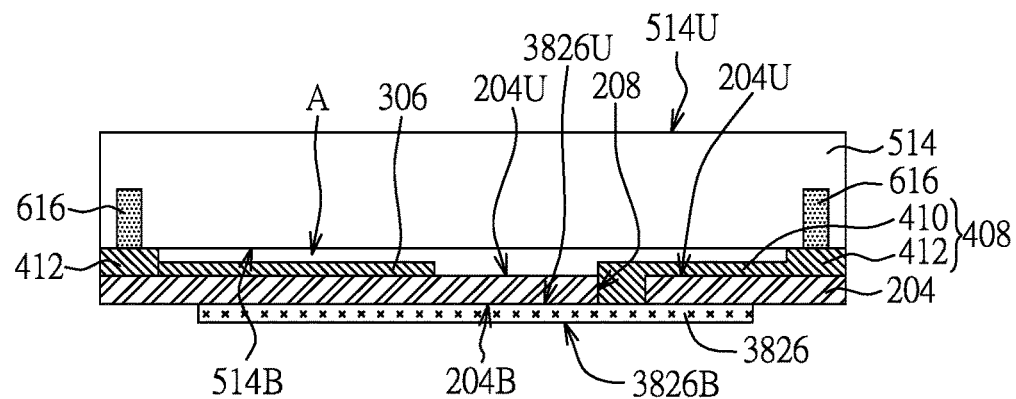
FIGS. 3A-3C show cross-sectional views of the acoustic wave device 300 with corresponding manufacturing steps in accordance with the third embodiment of the present application.
Figure 3B:
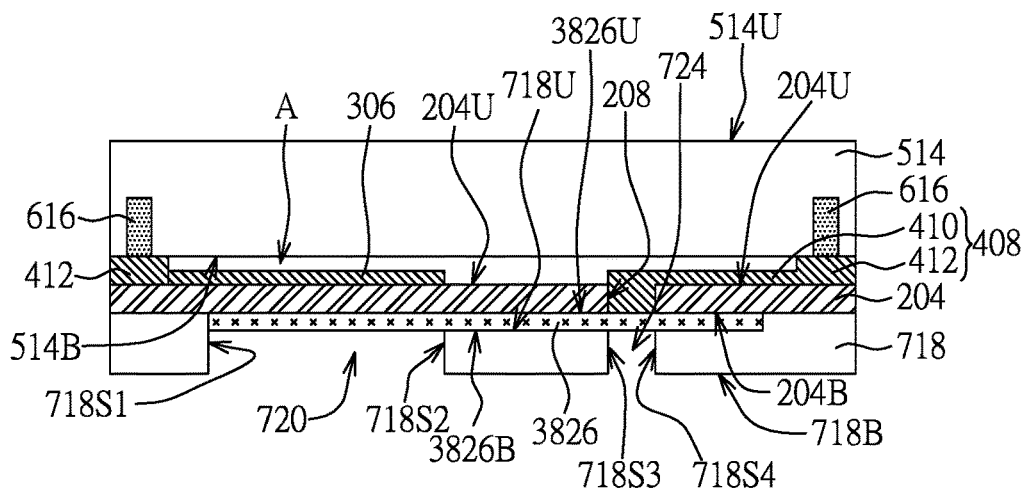
Figure 3C:
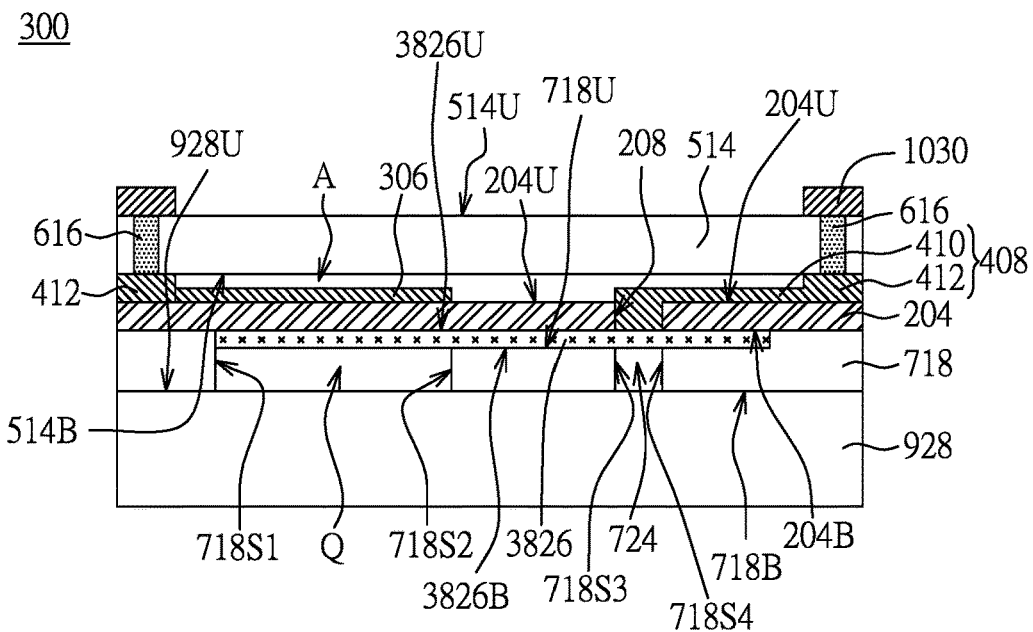

FIGS. 3A-3C show cross-sectional views of the acoustic wave device 300 with corresponding manufacturing steps in accordance with the third embodiment of the present application. After performing the manufacturing step similar to that described in FIGS. 1A-ID, as shown in FIG. 3A, a lower electrode 3826 is formed on the lower piezoelectric surface 204B and the lower surface of the conductive layer 410 exposed by the opening 208.

Next, referring to FIG. 3B, the lower electrode 3826 includes a lower electrode surface 3826B, and a support layer 718 is disposed on the lower electrode surface 3826B. The method for disposing the support layer 718 may include forming an insulating material layer on the lower electrode surface 3826B by deposition and then forming a first opening 720 and a second opening 724 in the insulating material layer by photolithography and etching to form the support layer 718. The deposition process may include chemical vapor deposition or physical vapor deposition such as sputtering. The support layer 718 includes a non-monocrystalline material, such as silicon, oxide, nitride or oxynitride. The oxide includes silicon oxide ($SiO_2$) or silicon nitride (SiN), and the silicon includes poly silicon or amorphous silicon. The first opening 720 and the second opening 724 expose the lower electrode surface 3826B. As shown in FIG. 3B, the support layer 718 includes an upper support surface 718U, and the lower electrode 3826 is located between the lower piezoelectric surface 204B and the upper support surface 718U. In an embodiment, the thickness of the support layer 718 is in a range of 50 μm to 200 μm. In this embodiment, the support layer 718 is formed after forming the lower electrode 3826. Because the lower piezoelectric surface 204B is a flat surface, the whole lower electrode surface 3826B is on the same horizontal plane with a fixed horizontal position so there is no height difference (the distance between the surfaces at different horizontal positions). Therefore, the lower electrode 3826 is not easy to be broken and the problem of disconnection can be avoided.

As shown in FIG. 3C, similar to the first embodiment, a lower cover 928 is provided. The support layer 718 includes a lower support surface 718B. The lower cover 928 is bonded to the lower support surface 718B and the upper cover is thinned. The upper cover 514 includes a first upper surface 514U. An electrode can be disposed on the first upper surface 514U. The electrode may include a plurality of contact pads 1030 disposed on the conductive channels of the conductive elements 616 exposed by the first upper surface 514U, and electrically connected to the conductive elements 616. A lower cavity Q is formed between the lower electrode 3826 and the lower cover 928 and corresponding to the first opening 720.

The acoustic wave device 300 manufactured according to the manufacturing method of the third embodiment is shown in FIG. 3C. The difference between the acoustic wave device 100 shown in FIG. 1H is explained as follows. The lower electrode 3826 has a coplanar structure, that is, the whole upper electrode surface 3826U is a first plane at a first fixed horizontal position and the whole lower electrode surface 3826B is a second plane at a second fixed horizontal position. In other words, the entire upper electrode surface 3826U is coplanar, and the entire lower electrode surface 3826B is coplanar. The lower electrode 3826 is located between the lower piezoelectric surface 204B and the upper support surface 718U. The support layer 718 is located on the lower piezoelectric surface 204B and the lower electrode surface 3826B. In this embodiment, the resonance region of the acoustic wave device 300 is defined by the upper electrode 306. Specifically, the support layer 718 includes the first inner sidewall 718S1 and the second inner sidewall 718S2 separated from the first inner sidewall 718S1 by the lower cavity Q. The upper electrode 306 extends beyond the first inner sidewall 718S1, connects to the conductive pad 412 and does not exceed the second inner sidewall 718S2. For example, the electrode sidewall surface of the upper electrode 306 may substantially flush with the second inner sidewall 718S2.

Fourth Embodiment

Figure 4A:
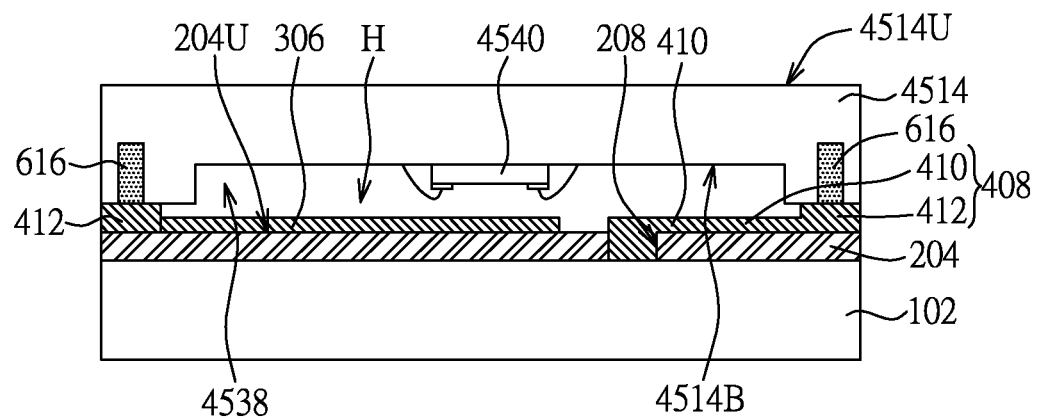
FIGS. 4A-4B show cross-sectional views of the acoustic wave device 400 with corresponding manufacturing steps in accordance with the fourth embodiment of the present application.
Figure 4B:
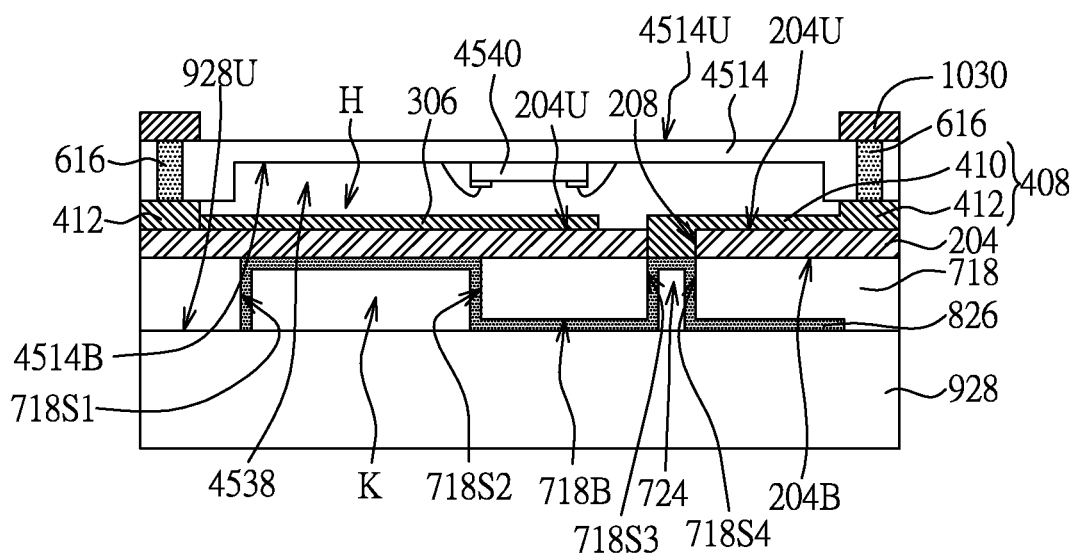

FIGS. 4A-4B show cross-sectional views of the acoustic wave device 400 with corresponding manufacturing steps in accordance with the fourth embodiment of the present application. After performing the manufacturing step similar to that described in FIGS. 1A-1B, referring to FIG. 4A, an upper cover 4514 is provided. The difference between the upper cover 4514 in FIG. 4A and the upper cover 514 in FIG. 1C is that the upper cover 4514 includes a groove 4538 facing the piezoelectric layer 204. In an embodiment, the upper cover 4514 is etched to form the groove 4538, and then the conductive elements 616 in the upper cover 4514 with the groove 4538 is bonded to the conductive pads 412. In another embodiment, the passive element 4540 can be disposed in the groove 4538 to reduce the volume of the acoustic wave device 400. The passive element 4540 not only can be disposed in the groove 4538 in a way of flip chip as shown in FIG. 4A, but also can be electrically connected to the conductive circuit (not shown) disposed on the upper cover 4514 by other methods such as wire bonding. Then, the upper cover 4514 can be bonded to the conductive pads 412 and disposed on the upper electrode 306.

For the structure shown in FIG. 4A, the manufacturing steps described in FIGS. 1D-1G can be continued so the substrate 102 is removed, the lower electrode 826 and the support layer are formed, and the lower cover is bonded. Then, referring to FIG. 4B, the upper cover 4514 is thinned. For example, the upper cover 4514 includes a first upper surface 4514U, and the first upper surface 4514U is polished by chemical mechanical polishing to expose the conductive elements 616. An electrode can be disposed on the first upper surface 4514U. The electrode may include a plurality of contact pads 1030 disposed on the conductive channels of the conductive elements 616 exposed by the first upper surface 4514U, and electrically connected to the conductive elements 616. An upper cavity H is formed among the piezoelectric layer 204, the conductive structure 408 (including the conductive layer 410 and the conductive pads 412), the upper electrode 306 and the upper cover 4514. Compared with the foregoing embodiments, the upper cavity H of the acoustic wave device 400 includes the groove 4538. Therefore, the upper cavity H has a larger cavity volume, which can avoid the problem that the piezoelectric layer 204 touches the upper cover and adheres to contaminants such as particles to cause the resonance frequency to change during the vibration.

The concepts of the embodiments disclosed above can be adjusted arbitrarily. For example, both the upper cover and the lower cover may have the grooves, and the passive elements may be disposed in the grooves of the upper cover and/or the lower cover. The lower electrode may have a coplanar structure, that is, the whole upper electrode surface of the lower electrode is a first plane at a first fixed horizontal position and the whole lower electrode surface of the lower electrode is a second plane at a second fixed horizontal position or the bridge structure according to the needs. The upper electrode may be disposed on the upper cavity and extends beyond both of the first inner sidewall and the second inner sidewall of the support layer, or only extends beyond one of the first inner sidewall and the second inner sidewall of the support layer.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

What is claimed is:

1. An acoustic wave device, comprising:
a piezoelectric layer, comprising an upper piezoelectric surface and a lower piezoelectric surface;
an upper electrode formed on the upper piezoelectric surface;
a lower electrode;
a support layer, comprising a non-monocrystalline insulating material;
a lower cover comprising a groove; and
a passive element in the groove,
wherein the lower electrode and the support layer are between the lower cover and the lower piezoelectric surface.

2. The acoustic wave device of claim 1, wherein the groove does not overlap with the support layer in a thickness direction of the lower cover.

3. The acoustic wave device of claim 1, wherein the lower electrode comprises an upper electrode surface and a lower electrode surface, the whole upper electrode surface is a first plane at a first fixed horizontal position, and the whole lower electrode surface is a second plane at a second fixed horizontal position.

4. The acoustic wave device of claim 1, wherein the support layer comprises an upper support surface, the lower electrode formed between the lower piezoelectric surface and the upper support surface.

5. The acoustic wave device of claim 1, further comprising an upper cover, wherein the upper electrode is formed between the upper cover and the upper piezoelectric surface, and the upper cover comprises a groove.

6. The acoustic wave device of claim 5, further comprising a passive element in the groove.

7. The acoustic wave device of claim 1, further comprising a cavity formed between the support layer and the lower cover, wherein the support layer comprises a first inner sidewall and a second inner sidewall opposite to the first inner sidewall and separated from the first inner sidewall by the cavity.

8. The acoustic wave device of claim 7, wherein the upper electrode is formed on the cavity, extends beyond the first inner sidewall and does not exceed the second inner sidewall.

9. The acoustic wave device of claim 1, further comprising a conductive structure formed on the upper piezoelectric surface, and electrically connected to the upper electrode and the lower electrode.

10. The acoustic wave device of claim 9, further comprising an opening in the piezoelectric layer, wherein the conductive structure comprises a conductive layer and a plurality of conductive pads, wherein the conductive layer fills the opening and extends on the upper piezoelectric surface, one of the conductive pads is electrically connected to the upper electrode, and another one of the conductive pads is electrically connected to the lower electrode through the conductive layer.

11. The acoustic wave device of claim 10, further comprising an upper cover and a plurality of conductive elements formed in the upper cover, wherein the conductive elements are electrically connected to the conductive pads respectively.

12. The acoustic wave device of claim 11, wherein the upper cover comprises an upper surface, and the acoustic wave device further comprises a plurality of contact pads formed on the upper surface and electrically connected to the conductive elements respectively.

13. The acoustic wave device of claim 1, wherein the support layer comprises an opening and a lower support surface adjacent to the lower cover, wherein the lower electrode is formed in the opening and extends to the lower support surface.

14. The acoustic wave device of claim 13, wherein a part of the lower electrode is between the lower support surface and the lower cover.

15. A manufacturing method of an acoustic wave device, comprising:
   providing a substrate;
   forming a piezoelectric layer on the substrate by epitaxial growth, wherein the piezoelectric layer comprises an upper piezoelectric surface and a lower piezoelectric surface;
   forming an upper electrode on the upper piezoelectric surface;
   forming an upper cover on the upper electrode;
   removing the substrate;
   forming a lower electrode on the lower piezoelectric surface;
   forming a support layer on the lower piezoelectric surface; and
   forming a lower cover on the lower electrode and the support layer,
   wherein said forming the support layer on the lower piezoelectric surface is performed after said removing the substrate.

16. The manufacturing method of an acoustic wave device of claim 15, wherein the step of forming a support layer on the lower piezoelectric surface comprises forming a non-monocrystalline insulating material on the lower piezoelectric surface.

17. The manufacturing method of an acoustic wave device of claim 15, wherein the step of forming a lower electrode on the lower piezoelectric surface is before the step of forming a support layer on the lower piezoelectric surface.

18. The manufacturing method of an acoustic wave device of claim 15, wherein the lower cover comprises a groove.

19. The manufacturing method of an acoustic wave device of claim 15, wherein the upper cover comprises a groove.

* * * * *